United States Patent [19]

Brissot

[11] 4,125,425
[45] Nov. 14, 1978

[54] METHOD OF MANUFACTURING FLAT TAPES OF CRYSTALLINE SILICON FROM A SILICON MELT BY DRAWING A SEED CRYSTAL OF SILICON FROM THE MELT FLOWING DOWN THE FACES OF A KNIFE SHAPED HEATED ELEMENT

[75] Inventor: Jean-Jacques L. E. Brissot, Maisons-Alfort (Val de Marne), France

[73] Assignee: U.S. Philips Corporation, New York, N.Y.

[21] Appl. No.: 772,349

[22] Filed: Feb. 28, 1977

Related U.S. Application Data

[63] Continuation of Ser. No. 553,987, Feb. 28, 1975, abandoned.

[30] Foreign Application Priority Data

Mar. 1, 1974 [FR] France ................ 74 07044

[51] Int. Cl.² ................ B01J 17/18; B01J 17/16
[52] U.S. Cl. ................ 156/617 R; 156/DIG. 88; 156/DIG. 96; 264/81
[58] Field of Search ................ 264/81, 82; 427/86; 156/600, 608, DIG. 88, 617 R; 148/172, 174; 65/203, 325, 326, 327, 347

[56] References Cited

U.S. PATENT DOCUMENTS

| | | | |
|---|---|---|---|
| B 584,997 | 3/1976 | Ciszek | 156/DIG. 88 |
| 1,565,319 | 12/1925 | Fowle | 65/327 X |
| 1,583,793 | 5/1926 | Owen | 65/327 X |
| 1,605,736 | 11/1926 | Howard | 65/326 X |
| 1,673,907 | 6/1928 | Ferngren | 65/328 X |
| 1,692,585 | 11/1928 | Spinasse | 65/327 X |
| 1,735,595 | 11/1929 | Blair | 65/326 X |
| 1,759,229 | 5/1930 | Drake | 65/325 X |
| 1,810,921 | 6/1931 | Mambourg | 65/326 X |
| 1,829,641 | 10/1931 | Ferngren | 65/347 X |
| 2,840,489 | 6/1958 | Kempter et al. | 427/86 X |
| 2,876,147 | 3/1959 | Kniepkamp et al. | 156/608 |
| 2,879,189 | 3/1959 | Shockley | 148/172 X |
| 2,927,008 | 3/1970 | Shockley | 156/608 X |
| 2,964,396 | 12/1960 | Rummel et al. | 148/172 X |
| 2,977,258 | 3/1961 | Dunkle | 148/172 X |
| 3,015,592 | 1/1962 | Leopold | 148/172 X |
| 3,031,275 | 4/1962 | Shockley | 156/DIG. 88 |
| 3,096,158 | 7/1963 | Gaulé et al. | 156/608 X |
| 3,192,082 | 6/1965 | Tomono et al. | 148/172 |
| 3,297,423 | 1/1967 | Prislan | 65/347 X |
| 3,506,429 | 4/1970 | Overman | 65/326 X |
| 3,540,871 | 11/1970 | Dyer | 264/81 X |
| 3,556,732 | 1/1971 | Chi Chang et al. | 148/172 X |
| 3,582,287 | 6/1971 | Capita | 148/172 X |
| 3,615,261 | 10/1971 | Causey et al. | 148/172 X |
| 3,618,623 | 11/1971 | Boaz | 65/347 X |
| 3,650,703 | 3/1972 | Labelle et al. | 156/DIG. 88 |
| 3,682,609 | 8/1972 | Dockerty | 65/327 X |
| 3,745,043 | 7/1973 | Bradley | 148/174 X |
| 3,759,671 | 9/1973 | Bleil | 156/608 |
| 3,824,121 | 7/1974 | Bradley et al. | 148/174 X |
| 3,862,020 | 1/1975 | Woerner et. al. | 264/81 |
| 3,862,852 | 1/1975 | Kamins | 148/174 X |
| 3,977,934 | 8/1976 | Lesk | 156/617 R X |
| 3,996,094 | 12/1976 | Lesk | 156/DIG. 88 |

FOREIGN PATENT DOCUMENTS

| | | | |
|---|---|---|---|
| 236,141 | 12/1958 | Australia | 427/86 |
| 966,929 | 10/1950 | France | 65/347 |
| 111,300 | 12/1961 | Pakistan | 156/DIG. 88 |
| 913,674 | 12/1962 | United Kingdom | 156/DIG. 88 |
| 937,697 | 9/1963 | United Kingdom | 65/326 |
| 953,538 | 3/1964 | United Kingdom | 148/172 |

OTHER PUBLICATIONS

Barrett, D. L.; E. H. Myers; D. R. Hamilton and A. I. Bennett, "Growth of Wide, Flat Crystals of Silicon Web" in *J. Electrochem. Soc.*, Solid State Science, vol. 118, No. 6, Jun. 1971, pp. 952–957.

Swartz, J. C.; T. Surek and B. Chalmers, "The EFG Process Applied to the Growth of Silicon Ribbons," in *Journal of Electronic Materials*, vol. 4, No. 2, 1975, pp. 255–279.

*Primary Examiner*—Philip Anderson
*Attorney, Agent, or Firm*—Frank R. Trifari; Norman N. Spain

[57] ABSTRACT

A method of manufacturing bodies from meltable crystalline material in which a continuous tape of said material is manufactured by causing melted material to flow along at least one surface of a heated element, which surface is wetted by the melted material, and causing the tape to grow by drawing away a second near the lower side of the surface. Application in particular to the manufacture of semiconductor bodies, for example of silicon.

12 Claims, 6 Drawing Figures

METHOD OF MANUFACTURING FLAT TAPES OF CRYSTALLINE SILICON FROM A SILICON MELT BY DRAWING A SEED CRYSTAL OF SILICON FROM THE MELT FLOWING DOWN THE FACES OF A KNIFE SHAPED HEATED ELEMENT

This is a continuation of application Ser. No. 553,987, filed Feb. 28, 1975, now abandoned.

The present invention relates to a method of manufacturing bodies of meltable crystalline material, in which a continuous crystalline tape of said material is manufactured from melted material. The present invention also relates to a body of meltable crystalline material obtained by using said method.

As is known plate-shaped bodies of various meltable crystalline materials, preferably in monocrystalline form, are used for various purposes, for example plate-shaped bodies of semiconductor material, in particular germanium and silicon, and of various oxidic materials, for example, serving as a substrate for a semiconductor layer, or a layer of a material in which magnetic bubbles can be generated.

Such plate-shaped bodies were manufactured in general by sawing a rod-shaped single crystal. It has also been described, however, to obtain plate-shaped semiconductor bodies from a tape-shaped twinned crystal manufactured as a continuous tape by drawing at higher speed of a twinned seed crystal oriented in a suitable manner from a supercooled melt. Such methods are known both for germanium and for silicon. Plate-shaped semiconductor bodies can be obtained from such tape-shaped crystals with far smaller losses of material than upon sawing a monocrystalline rod. In particular in cases in which semiconductor devices having a large surface area are to be manufactured, for example, solar cells of silicon, the manufacture of tape-shaped single crystals may be of advantage. Such solar cells, united to form solar batteries, have proved of particular use in space research in which the electric supply of the sattelites is ensured by such solar cells to a considerable extent.

The traditional method of manufcturing monocrystalline silicon in thin plates for manufacturing a solar battery from cylindrical silicon single crystals obtained by drawing, by sawing them into slices, polishing said slices mechanically and then chemically, gives a loss of material exceeding 50% of the single crystal from which was started. For this reason, the manufacture of silicon in the form of a continuous tape by means of a suitable growth method should be preferred. Another method of manufacturing elongate single crystals of the desired cross-sectional shape, including the shape of a continuous tape, is described in British patent specification No. 1,205,544. According to this method an elongate monocrystalline crystal of a given cross-section is grown by means of a seed crystal which is contacted with a liquid film which covers the upper surface of an element with a surface according to the desired cross-sectional shape. Said element is placed in a crucible which is filled with the melted polycrystalline material of which it is desired to obtain an elongate crystal. The element has a gap and is manufactured from material which can be wetted by the melted material. The crucible is heated, the melted material penetrates into the gap due to capillarity and rises to appear at the top of the said gap and to form a thin liquid film in the vicinity of which the seed crystal of the said material is placed; a melting zone is then formed between the said thin film and the seed crystal. By drawing the seed crystal an elongate single crystal of said material having the desired cross-sectional shape, for example, the shape of a tape, is then grown. The supply of polycrystalline material should compensate for the drawn quantity of material which grows at the seed crystal in order that the crystal obtains a substantially uniform cross-section and interruption in the growth of the crystal is avoided.

This method has drawbacks, in particular when the manufacture of tape-shaped single crystals is concerned.

First of all, the method is based on the principle of capillarity in which the silicon in the gap arranged in the melting bath rises gradually. As a result of this the shape and the thickness of the drawn tape of monocrystalline silicon is restricted.

Furthermore, when the heating of the crucible is interrupted accidentally, the melt solidifies in the bath so that mechanical stresses may occur, in particular, if, as in the case of silicon the volume is increased. This may result in damage of the device used and loss of the material.

Another drawback consists of the fact that the melt contacts the wall of the melting crucible used (silicon oxide, for example, in the case of silicon) for a long time and this long contact may involve the incorporation of undesired impurities in the melting bath.

Furthermore, the growth from a melting bath necessitates the use of a comparatively large quantity of material as a result of which expensive material losses may occur in the case of errors in the process.

One of the objects of the present invention is to mitigate one or more of the said various drawbacks. According to the invention, a method of manufacturing bodies of meltable crystalline material in which a continuous crystaline tape of the material is manufactured from melted material is characterized in that the melted material is caused to flow over at least one surface of a heated element of a suitable shape, the element, at least at the said surface, consisting of a material which is wetted by the said melted material, that a seed, preferably a seed crystal of the material to be crystallized, is provided below the lower limit of the said surface and at a small distance herefrom, that the upper part of the said seed is wetted with the melt and the crystalline tape is formed by drawing away the seed.

According to a preferred embodiment the method may be used for the manufacture of tape-shaped semiconductor material, in particular silicon.

The atmosphere used may comprise at least one noble gas, for example, argon or helium, to which a given quantity of hydrogen may have been added. It is also possible to operate in a vacuum.

The lower limit of the surface of the heated element along which the melt flows is preferably rectilinear and/or preferably extends horizontal. According to a preferred embodiment, the element along which the melt flows may have the shape of a knife, in particular a balance knife or, according to another preferred embodiment, it may have the form of a plate having parallel or substantially parallel surfaces.

In general the element should be heated at a temperature which is at least equal to the melting temperature of the crystalline material and is preferably not much higher than that melting temperature.

In accordance with the desired thickness of the tape of the crystalline material to be obtained, a suitable thickness of the lower part of the heated element along which the melt flows is preferably adjusted. If desired, said thickness may be between a few tens of microns and a few millimeters.

A flat seed is preferably used.

The distance between the lower part of the surface along which the melted material flows and the upper part of the seed is chosen in accordance with the desired thickness of the drawn crystalline tape. The rate at which the seed is drawn away is also of influence. If it is drawn away too rapidly, the danger of fracture in the growth of the crystalline tape occurs. Drawing downwards of a silicon single crystal is preferably carried out at a rate in the order of a few millimeters per minute.

It is desirble for the element to be heated in a suitable manner, for example, by high frequency heating or heating by radiation.

The element, at least the surface along which the material flows, consists preferably of a refractory material which in addition to the property of being wetted by the melted material shows the property of being resistant to the action of the melted material.

The said refractory material, in particular when melted silicon is used, is preferably selected from the class comprising carbon, for example, pyrolithic carbon, silicon carbide, SiC, and titanium carbide TiC.

It is also possible for the element to consist of a refractory electrically conductive core covered with a thin layer or a refractory non-conductive or high-ohmic material which has a good resistance against the action of the melted material. The material for said thin layer is preferably selected from the class comprising silicon nitride, $Si_3N_4$, and very pure silicon carbide, SiC, for example, of semiconductor quality.

The starting material for the seed crystal can be supplied to the heated element in various manners. According to a preferred embodiment this occurs from solid meltable material which is heated to the melting temperature. According to a further preferred embodiment the meltable material can be prepared by deposition on the heated element from at least one compound of the component(s) of the meltable material. For the deposition of silicon, suitable silane compounds are to be considered. According to a preferred embodiment decomposition of silane is used. According to another preferred embodiment reduction of chlorosilane by means of hydrogen is used for that purpose.

In the method according to the present invention the quantity of melt at any instant may be comparatively small, which requires a small electric power of the device used.

A second advantage is that the method can generally be discontinued at any instant without any objections, the design of the apparatus used being such that cooling does not result in fracture of those parts of the apparatus which contact the melted material.

Furthermore, crystal drawing takes place by means of a downward movement. Drawing thus is facilitated by gravity in contrast with the methods used so far.

It is to be noted that the lower part of the heated element need not necessarily be rectilinear. If said lower part is rectilinear indeed, the resulting tape is flat. In other cases the tape obtains a shape having a cross-section which corresponds to the shape of the lower end of the heated element. In principle the lower end may form a closed curve, the tape-shaped crystal obtaining the shape of a tube.

The invention will be described in greater detail with reference to the accompanying diagrammatic drawings in which heated elements for use in embodiments of the method according to the invention are shown diagrammatically.

FIGS. 1a and 1b relate to successive stages of an embodiment of the method according to the invention and that one in an initial phase of the crystal growth and one some time thereafter.

FIG. 2 relates to a second embodiment of the method according to the invention.

For the sake of simplicity and clarity, corresponding parts are referred to by the same numerals in the various Figures.

Figure 1A:
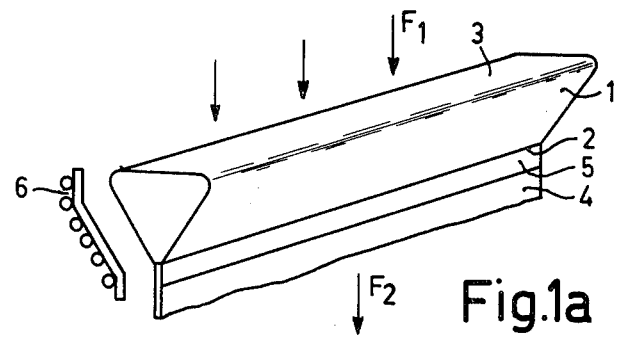
Figure 1B:
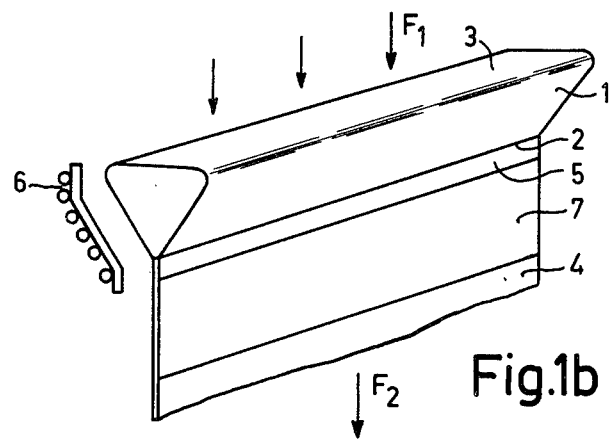

FIGS. 1a and 1b show a heated element 1 in the form of a balance knife, the lower part of which is denoted by 2. Solid silicon, for example, in the form of grains or rods of silicon extending in the direction of the arrows $F_1$ is contacted with the surface 3 opposite to the lower part 2.

The said silicon is heated by means of suitable heating means, high frequency heating means for example, which heating means, denoted by 6, are shown only diagrammatically. The experiments are preferably carried out in an atmosphere of a noble gas, for example argon or helium. The liquid silicon flows over the said element 1, the surface of which is wetted by the melt and lands at the lower part 2 of the element 1. A flat seed crystal of silicon is placed at a small distance from the said part 2. A molten zone 5 is formed between the said part 2 and the flat seed crystal 4 (see FIG. 1a).

If a gradual displacement (or drawing) in the direction of the arrow $F_2$ is performed, a continuous tape 7 of monocrystalline silicon is gradually grown on the seed crystal 4 of silicon (see FIG. 1b).

Figure 2:
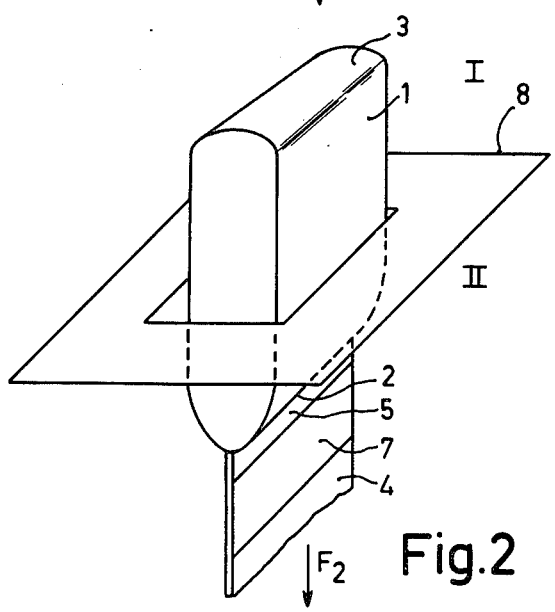

FIG. 2 shows in a second embodiment a stage in the growth of a tape-shaped silicon crystal comparable to the stage shown in FIG. 1b. According to this embodiment the supply of silicon occurs from gaseous compounds. The spaces referred to by I and II are separated from each other by a gaseous or solid screen which is referred to diagrammatically by 8. If the screen is solid, it need not be in contact with the heated element; an intermediate space may be present where a suitable gas circulation is maintained. The reaction which makes it possible to obtain silicon takes place in the space referred to by I. Chlorosilane is supplied, for example, through suitable supply tubes and is reduced by means of hydrogen in the vicinity of the elements. The molten silicon thus formed flows across the element 1, while the hydrogen chloride formed by the reaction is dissipated. The screen 8 makes it possible to separate the said hydrogen chloride from the preferred atmosphere of noble gas in which the crystalline growth of the silicon tape takes place.

Figure 3:
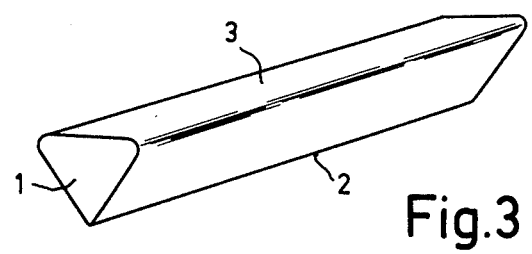
FIG. 3 is a perspective view of a knife-shaped heating element as used in the embodiment of the method according to the invention described with reference to FIGS. 1a and 1b.

FIG. 3 is a perspective view of a knife-shaped heated element. The lower part 2 has a small thickness. Polycrystalline silicon may be provided on the upper part 3.

Figure 4:
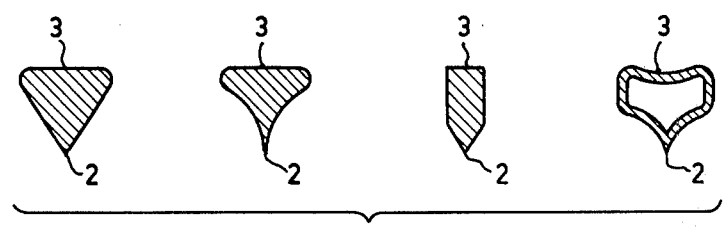
FIG. 4 shows various examples of knife-shaped heated elements in a vertical cross-section as they may be used in the method according to the invention.

The cross-sectional view of FIG. 4 shows various possible heated elements in knife form; they comprise a substantially horizontal part 3 which is destined to provide silicon and a lower part 2 of a small thickness from which, due to the presence of a monocrystalline seed, a tape-shaped crystal can be drawn. The elements may be solid or hollow.

Figure 5:
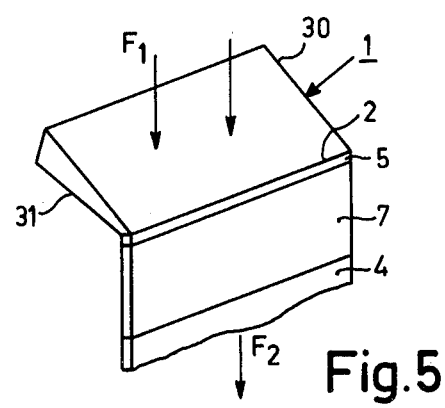
FIG. 5 is a perspective view of a heated element in the form of a plate having inclined surfaces which enclose a small angle, also for use in the scope of the invention.

FIG. 5 finally shows a heated element which has the form of a plate having non-parallel surfaces which are inclined. It is also possible to arrange a plate having parallel, inclined or vertical surfaces along which the melt can flow. As shown in FIG. 5, the melt will flow across the surface 30 and wet said surface. Due to the wetting, the melt creeps along the surface 31 upwards. Between the lower part 2 and a flat seed crystal 4 provided therebelow, a melt zone 5 is formed. By gradually drawing the seed crystal 4 downwards in the direction of the arrow 2, a continuous tape of monocrystalline material grows gradually on the upper side of the seed crystal.

In the absence of a monocrystalline seed, a tape of polycrystalline silicon can be obtained by drawing in a corresponding manner.

Within the scope of the present invention it is also possible to use other shapes of elements which can be wetted by molten silicon or other material, as well as other methods of supplying the material to be crystallized.

Furthermore, other meltable crystalline materials in tape form can also be obtained without departing from the scope of the present invention.

What is claimed is:

1. A method of manufacturing flat tapes of crystalline silicon, said method comprising contacting a supply of solid silicon with the upper surface of an element heated to the melting point of said silicon, to thereby convert said solid silicon into a molten silicon mass flowing downwardly over the outer surface of said heated element, said element being a cylinder having a horizontal axis, a first surface essentially parallel to said horizontal axis and two additional surfaces extending downwardly from the edges of said first surface and meeting each other at their lower edges to form a rectangular shaped rim, the surface of said element being resistant to the action of said molten silicon mass and at least said two downwardly extending surfaces and said rim being formed of a material wettable by said molten silicon mass, contacting said downwardly flowing molten silicon mass with a silicon crystal seed positioned at a small distance below the lower edge of said rectangular shaped rim to thereby wet the upper surface of said crystal seed with said downwardly flowing molten silicon mass and drawing said thus wetted seed crystal downwardly from said element to thereby cause said molten silicon mass to solidify and grow a downwardly extending flat crystalline silicon tape.

2. The method of claim 1 wherein said element at least at its surface is formed of a refractory carbon containing material.

3. A method as claimed in claim 1, characterized in that the element at least at its surface is formed of a refractory material selected from the group consisting of carbon, silicon carbide, and titanium carbide.

4. A method as claimed in claim 1, characterized in that the element consists of a refractory conductive coil coated with a thin layer of a refractory non-conductive or high-ohmic material which has a high resistivity against the action of the molten material.

5. A method as claimed in claim 4, characterized in that the thin layer of the element consists of a material selected from the group consisting of silicon nitride, and very pure silicon carbide.

6. A method as claimed in claim 1, characterized in that the lower limit of the surface of the element along which the molten silicon mass flows is horizontal.

7. A method as claimed in claim 1, characterized in that the element along which the molten silicon mass flows has the form of a knife, in particular a balance knife.

8. A method as claimed in claim 1, characterized in that the shape of the element along which the molten silicon mass flows is that of a plate having parallel or substantially parallel surfaces.

9. A method as claimed in claim 1, characterized in that the element along which the molten silicon mass flows is heated at a temperature which is slightly higher than that of the melting point of the silicon material to be crystallized from the melt.

10. A method as claimed in claim 1, characterized in that the desired thickness of the tape of the crystalline silicon material is obtained by adjusting the thickness of the lower part of the heated element.

11. A method as claimed in claim 1, characterized in that the seed is flat.

12. A method as claimed in claim 1, characterized in that the drawing of the crystalline silicon tape is carried out at a rate in the order of a few millimeters per minute.

* * * * *